(12) United States Patent
Meiser et al.

(10) Patent No.: US 8,710,575 B1
(45) Date of Patent: Apr. 29, 2014

(54) SEMICONDUCTOR DEVICE, INTEGRATED CIRCUIT AND METHOD OF MANUFACTURING AN INTEGRATED CIRCUIT

(71) Applicant: Infineon Technologies AG, Neubiberg (DE)

(72) Inventors: Andreas Meiser, Sauerlach (DE); Werner Schwetlick, Groebenzell (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/754,997

(22) Filed: Jan. 31, 2013

(51) Int. Cl.
*H01L 29/788* (2006.01)
*H01L 21/336* (2006.01)
*H01L 27/115* (2006.01)
*H01L 29/423* (2006.01)

(52) U.S. Cl.
CPC ..... *H01L 27/11536* (2013.01); *H01L 29/42328* (2013.01)
USPC .......................................... 257/318; 438/270

(58) Field of Classification Search
CPC .................... H01L 27/11558; H01L 29/42328
USPC ........................... 257/318, 319, 320; 438/270
See application file for complete search history.

(56) References Cited

U.S. PATENT DOCUMENTS

| | | | | |
|---|---|---|---|---|
| 5,656,544 A | * | 8/1997 | Bergendahl et al. | 438/386 |
| 6,087,695 A | * | 7/2000 | Chen | 257/314 |
| 7,375,393 B1 | * | 5/2008 | Mirgorodski et al. | 257/316 |
| 2007/0096197 A1 | * | 5/2007 | Jang et al. | 257/315 |
| 2008/0135916 A1 | * | 6/2008 | Kim et al. | 257/316 |
| 2010/0118610 A1 | * | 5/2010 | Katsumata et al. | 365/185.18 |
| 2012/0292694 A1 | * | 11/2012 | Hsieh | 257/331 |

\* cited by examiner

*Primary Examiner* — William D Coleman
(74) *Attorney, Agent, or Firm* — Murphy, Bilak & Homiller, PLLC

(57) ABSTRACT

A semiconductor device is formed in a semiconductor substrate comprising a first main surface and includes a control gate disposed in a lower portion of a first trench formed in the first main surface, a floating gate disposed in the first trench above the control gate and insulated from the control gate, a source region of a first conductivity type, a body region of a second conductivity type, and a drain region of the first conductivity type.

19 Claims, 14 Drawing Sheets

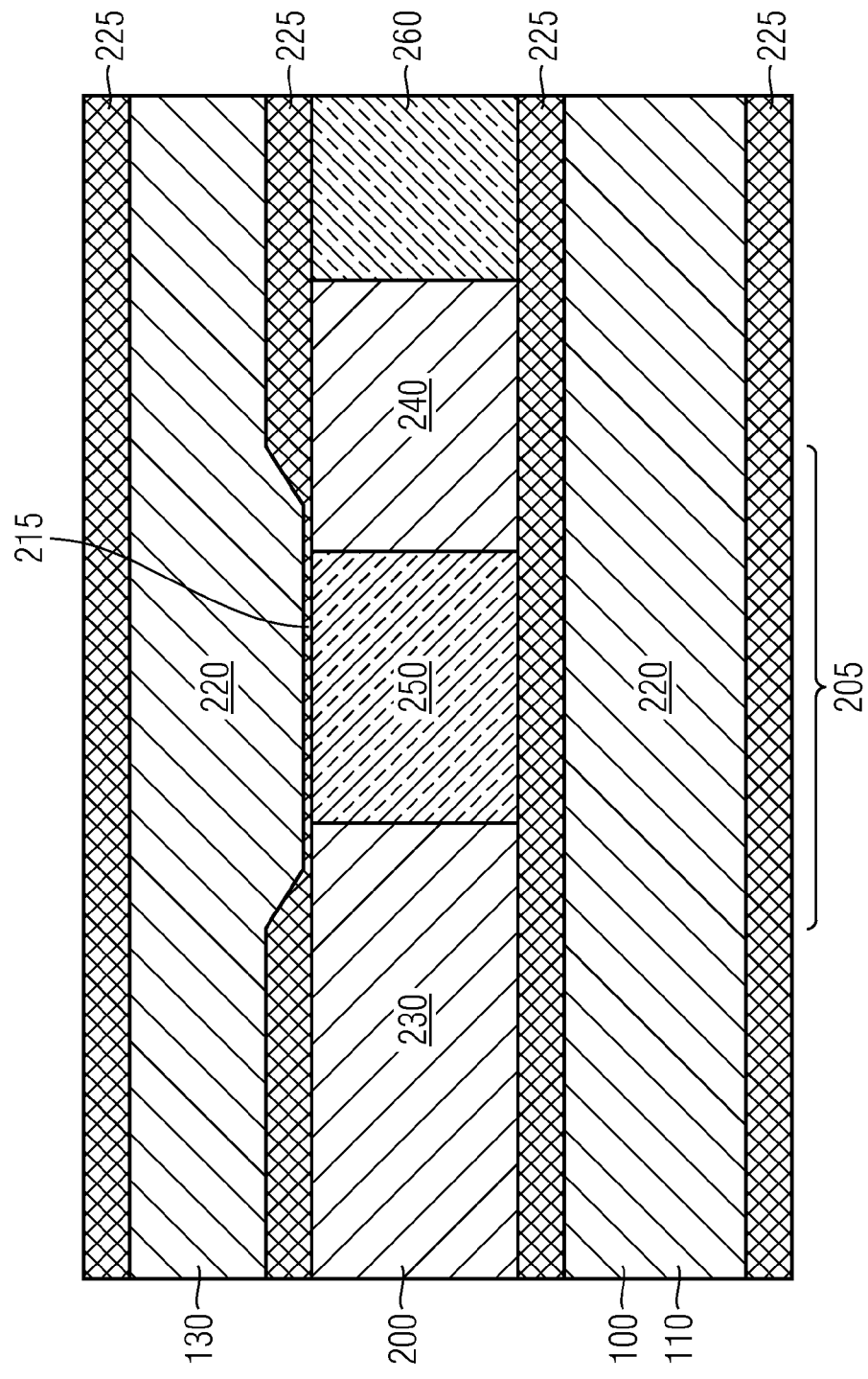

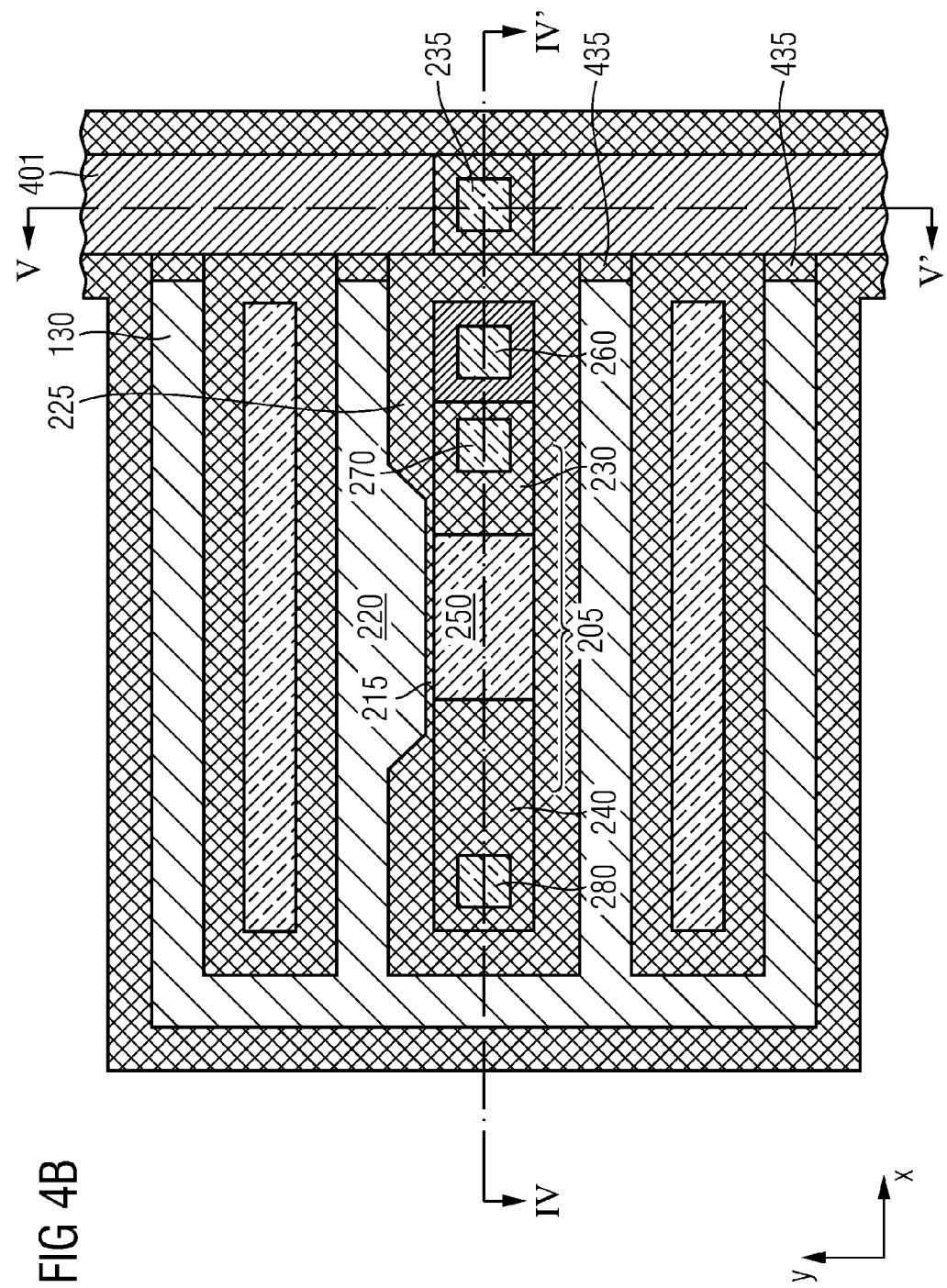

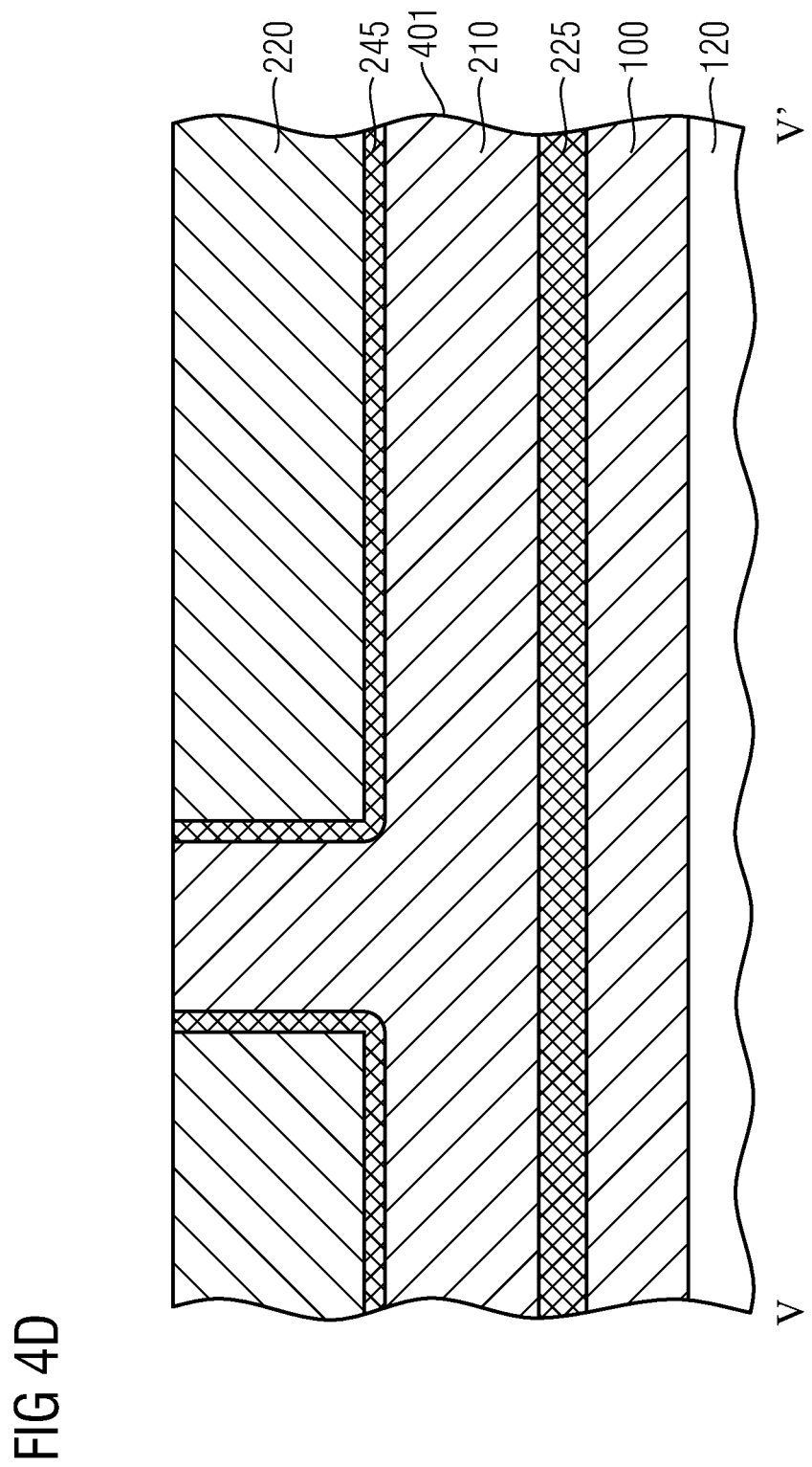

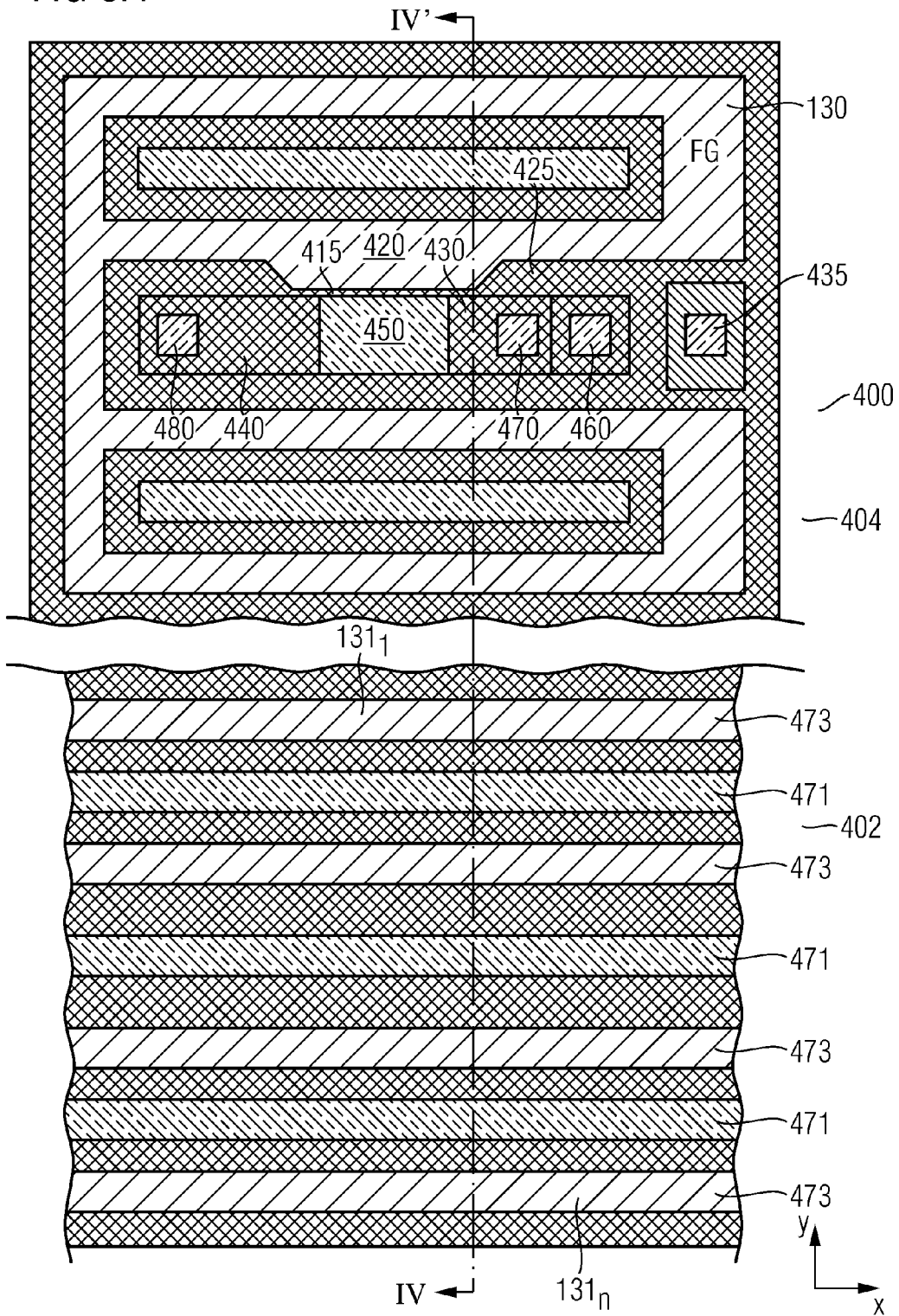

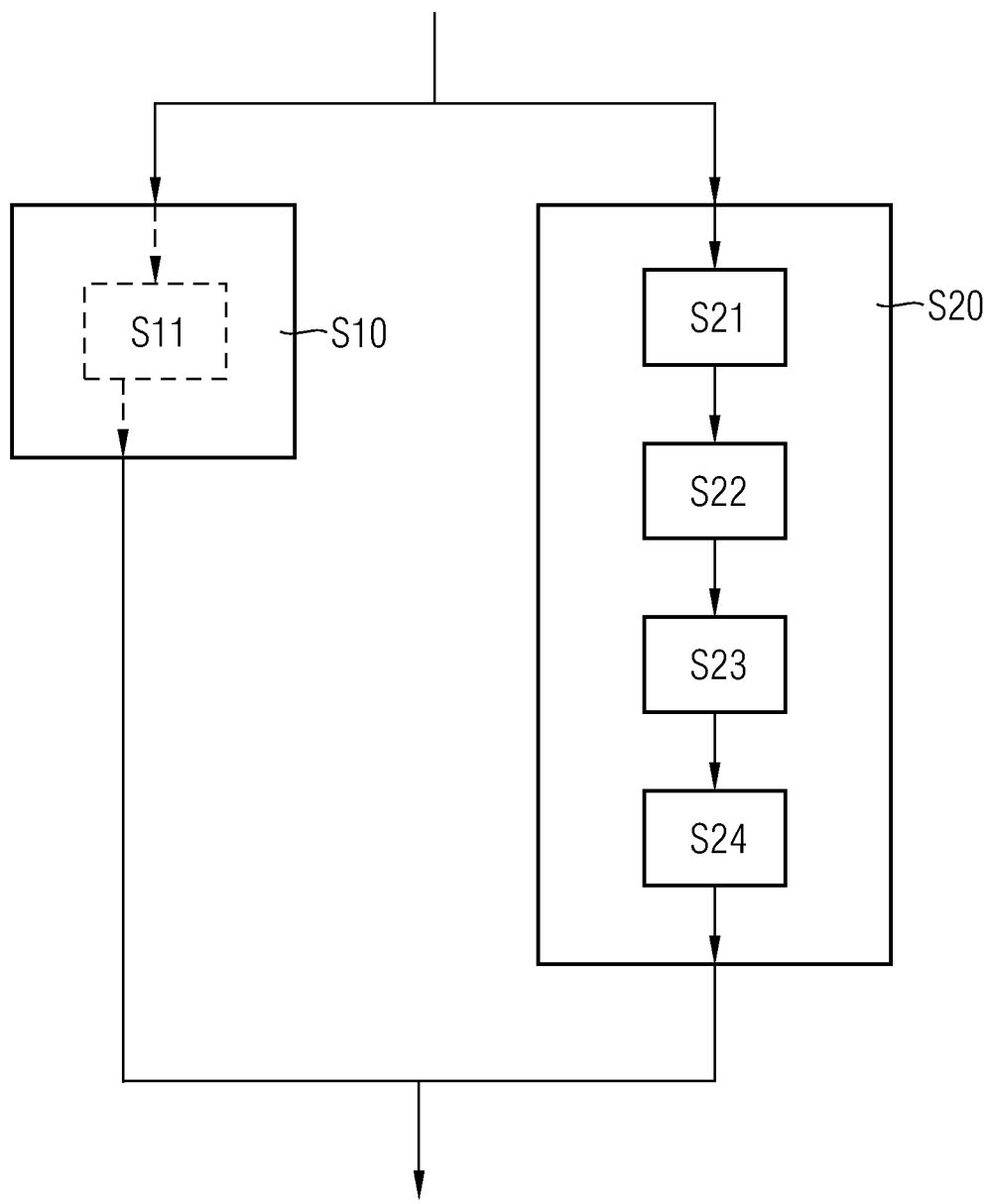

US 8,710,575 B1

SEMICONDUCTOR DEVICE, INTEGRATED CIRCUIT AND METHOD OF MANUFACTURING AN INTEGRATED CIRCUIT

RELATED BACKGROUND

In the field of power MOSFETs and integrated circuits including a power transistor, non-volatile memories having a comparatively low storage capacity are increasingly in demand. For example, it would be desirable to provide a memory in order to store a chip ID or to adjust portions of a circuit after assembly, in order to increase the accuracy of the product, in order to be able to set up the properties of the product, and in order to perform adjustments and adaptations in accordance with a users needs.

Accordingly, further attempts to improve such a memory are being made.

SUMMARY

According to an embodiment, a semiconductor device is formed in a semiconductor substrate comprising a first main surface. The semiconductor device includes a control gate disposed in a lower portion of a first trench formed in the first main surface, a floating gate disposed in the first trench above the control gate and insulated from the control gate, a source region of a first conductivity type, a body region of a second conductivity type, and a drain region of the first conductivity type. A portion of the body region is adjacent to the floating gate.

According to a further embodiment, an integrated circuit is formed in a semiconductor substrate comprising a first main surface. The integrated circuit comprises a power transistor and a memory device. The memory device includes a control gate disposed in a lower portion of a first trench formed in the first main surface, a floating gate disposed in the first trench above the control gate and is insulated from the control gate, a source region of a first conductivity type, a body region of a second conductivity type, and a drain region of the first conductivity type.

According to an embodiment, a method of manufacturing an integrated circuit comprises forming a power transistor in a semiconductor substrate comprising a first main surface, and forming a memory device in the semiconductor substrate. Forming the memory device includes forming a first trench in the first main surface of the semiconductor substrate, forming a control gate in a lower portion of the first trench, forming a floating gate in the first trench above the control gate so as to be insulated from the control gate, forming a source region of a first conductivity type, a body region of a second conductivity type, and a drain region of the first conductivity type in the semiconductor substrate.

BRIEF DESCRIPTION OF THE DRAWINGS

The accompanying drawings are included to provide a further understanding of the embodiments and are incorporated in and constitute a part of this specification. The drawings illustrate the embodiments of the present application and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 shows a schematic plan view of components of a semiconductor device according to an embodiment;

FIG. 4B shows a plan view of a portion of a memory cell array according to an embodiment;

FIG. 4D shows another cross-sectional view of a portion of the memory cell array shown in FIG. 4B;

FIG. 5A shows a plan view of an integrated circuit according to an embodiment;

FIG. 6 illustrates steps for manufacturing the semiconductor device shown in FIGS. 1 to 5, respectively.

DETAILED DESCRIPTION

Figure 2A:
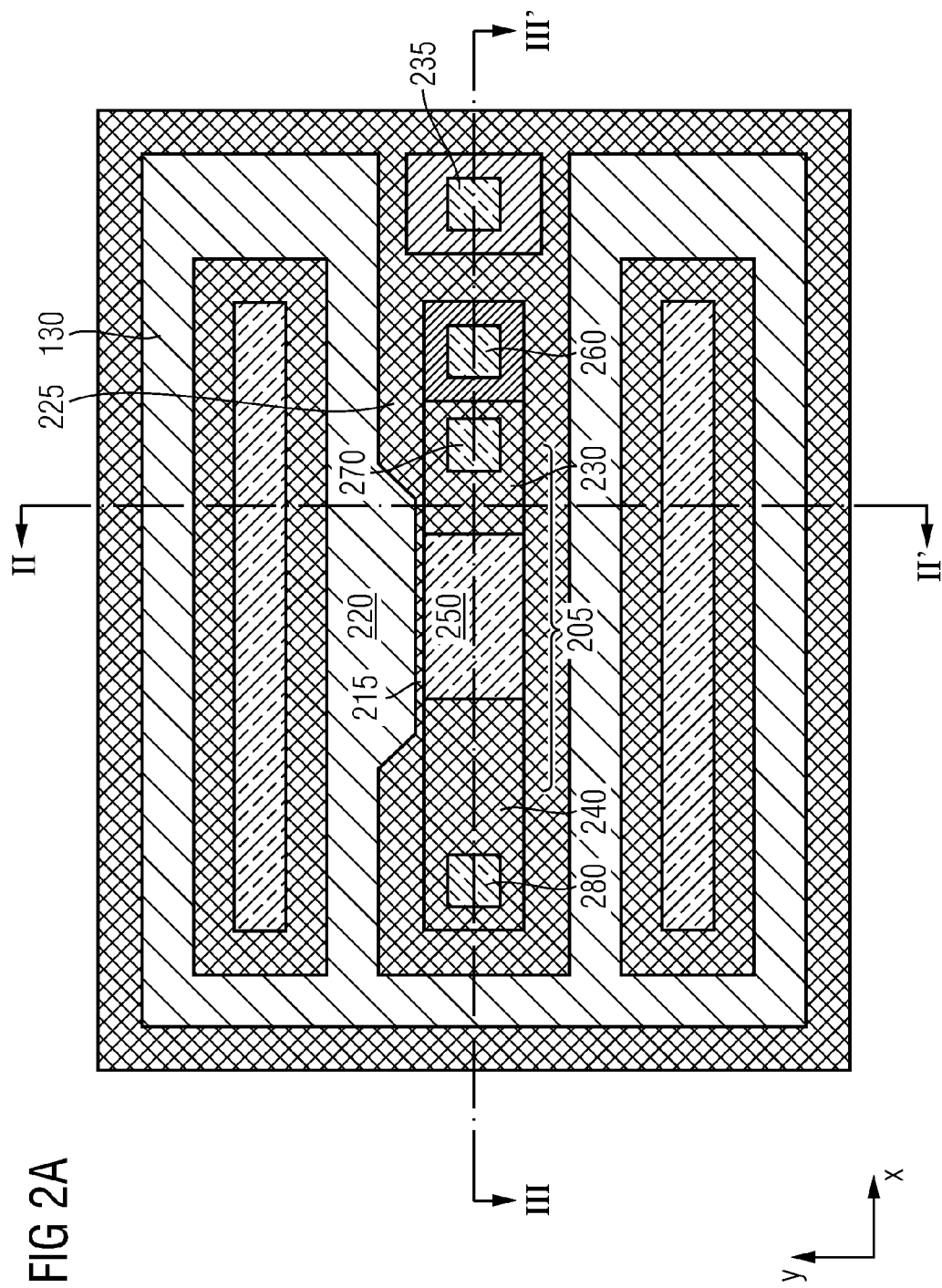
FIG. 2A shows a further plan view of components of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the application can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to embodiments of the present application, generally, silicon carbide (SiC) or gallium nitride (GaN) is a further example of the semiconductor substrate material.

The term "vertical" as used in this specification intends to describe an orientation which is arranged perpendicular to the first surface of the semiconductor substrate or semiconductor body.

The terms "lateral" and "horizontal" as used in this specification intends to describe an orientation parallel to a first surface of a semiconductor substrate or semiconductor body. This can be for instance the surface of a wafer or a die.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not intended to mean that the elements must be directly coupled together—intervening elements may be provided between the "coupled" or "electrically coupled" elements. The term "electrically connected" intends to describe a low-ohmic electric connection between the elements electrically connected together.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

FIG. 1 shows a plan view of a portion of a semiconductor device 200. The semiconductor device shown in FIG. 1 is formed in a semiconductor substrate 100 comprising a first main surface. The semiconductor device comprises a control gate (not shown in this Figure) disposed in a lower portion of a first trench 130 formed in the first main surface, and a floating gate 220 disposed in the first trench above the control gate and being insulated from the control gate. The semiconductor device further comprises a source region 230 and a drain region 240 of a first conductivity type, and a body region 250 of a second conductivity type. For example, the first conductivity type may be n doped and the second conductivity type may be p doped or vice versa. The semiconductor device may further comprise a first contact (not shown in this Figure) that is electrically coupled to the source region 230 and a second contact (not shown in this Figure) being electrically coupled to the drain region, the first and the second contacts being disposed at the first main surface 110. The semiconductor device 200 implements a memory device.

According to the embodiment shown in FIG. 1, the source regions 230 and the drain region 240 are disposed at the first main surface 110. For example, the source region 230 and the drain region 240 may be disposed adjacent to the first main surface 110. Further, optionally, the body region 250 may be disposed at the first main surface 110. The floating gate 220 is disposed in a trench adjacent to the body region 250 and adjacent to the source region 230 and the drain regions 240. A thin tunneling oxide layer 215 is disposed at a portion of the body region 250. The thin tunneling oxide layer 215 is disposed between a portion of the body region 250 and a portion of the floating gate 220. Further, a thicker dielectric layer 225 is disposed between the source and the drain regions and the floating gate 220 at other portions of the semiconductor device.

When an appropriate voltage is applied between the source region 230 and the control gate, charge carriers, for example, electrons, are moved to the floating gate 220, for example, by tunneling or by hot electron injection. The charge carriers that have moved to the floating gate are stored in the floating gate and influence a threshold voltage of the transistor. Accordingly, when a voltage is applied to the control gate, a current voltage characteristics between source region 230 and drain region 240 may be assessed and a charging state of floating gate may be read as stored information. The body region 250 is contacted by the body contact 260 that may be disposed adjacent to the first main surface 110 of the substrate.

FIG. 2A shows a plan view of a greater portion of a semiconductor device according to an embodiment. As is shown, the basic transistor 205 is enclosed by a trench 130. Portions of the trench 130 extend in the x-direction, other portions of the trench 130 extend in the y-direction. The trench 130 forms a closed pattern and may have, roughly speaking, a shape of a ring or of several rings attached to each other. The basic transistor 205 comprises a source region 230, a drain region 240 and a body region 250 that is disposed between the source region 230 and the drain region 240. A floating gate 220 is disposed in the trench 130. A tunneling oxide 215 is disposed between the floating gate 220 and the body region 250 in a region adjacent to the body region 250. The body contact 260 is disposed at the first main surface of the semiconductor substrate and is electrically coupled to the body region 250. Moreover, a first contact 270 is disposed adjacent to the first main surface and is electrically coupled to the source region 230. Further, a second contact 280 is disposed adjacent to the first main surface of a substrate and is electrically coupled to the drain region 240. The control gate (not shown in this Figure) is disposed in the trench 130 below the floating gate 220. The control gate is electrically coupled to the gate contact 235 that is disposed at the first main surface of the substrate. As is shown in FIG. 2A, the dielectric layer between the trench 130 and the basic transistor 205 has a varying thickness. For example, a thin tunneling layer 215 having a thickness of approximately 10 to 20 nm or less is disposed between the body region 250 and the floating gate 220 and the source region 230 and the floating gate 220. A thicker dielectric layer 225 is disposed at other portions of the basic transistor 205.

Figure 2B:
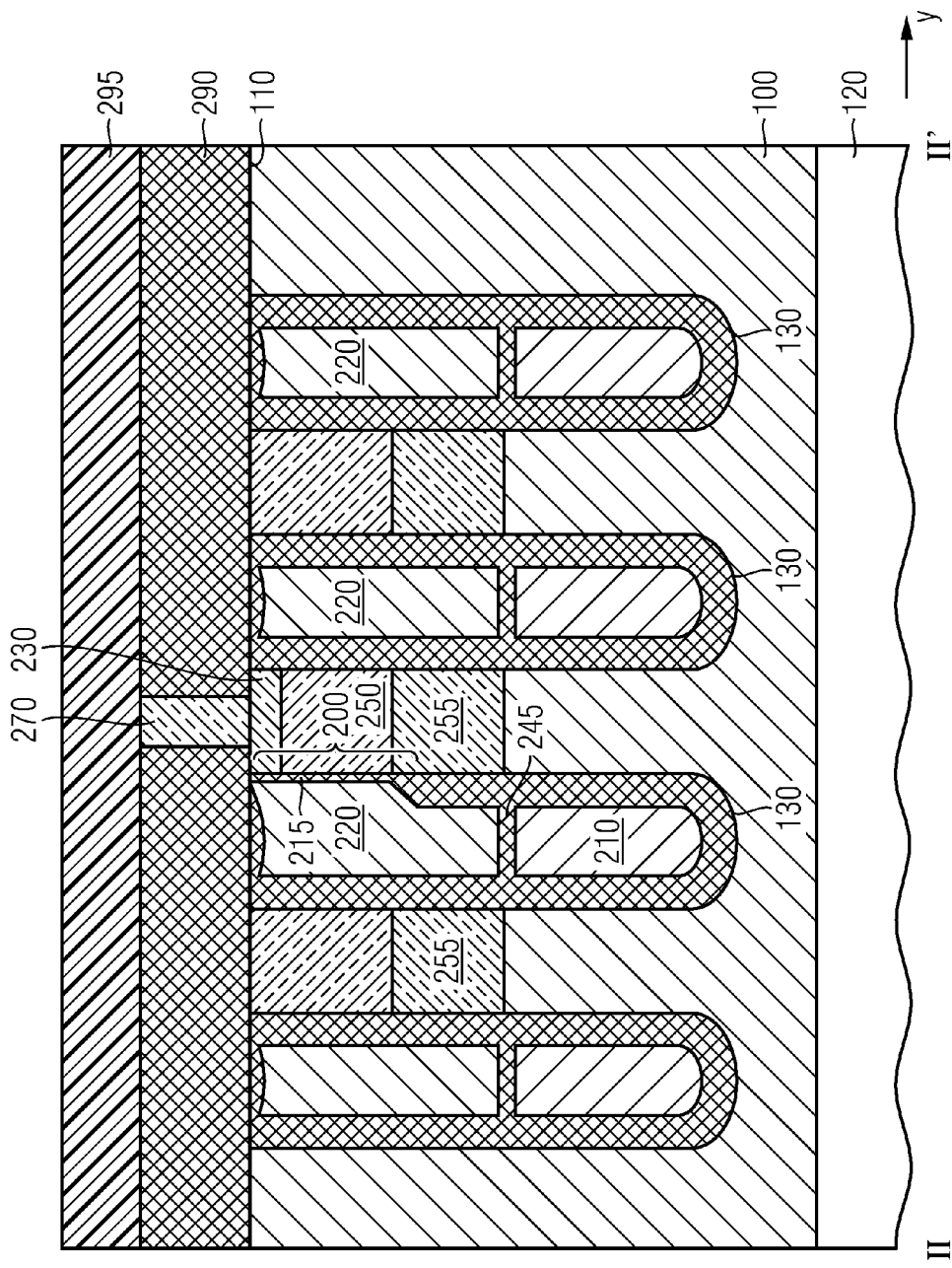
FIG. 2B shows a cross-sectional view of the semiconductor device shown in FIG. 2A.

FIG. 2B shows a cross-sectional view of the semiconductor device between II and II' as is also shown in FIG. 2A. A plurality of trenches 130 are formed in a semiconductor substrate 100 having a first main surface 110. The semiconductor substrate 100 may be doped with the first or second conductivity type. A heavily doped region 120 of the conductivity type corresponding to the conductivity type of the substrate is disposed in a lower portion of the semiconductor substrate 100. The control gate 210 is disposed in a lower portion of each of the trenches 130. Further, the floating gate 220 is disposed in an upper portion of each of the trenches 130, the floating gate being insulated from the control gate 210. For example, the floating gate 220 may be insulated from the control gate 210 by means of the insulating layer 245, which may be made of silicon oxide, having an appropriate thickness. According to further embodiments, the insulating layer may also comprise a so-called ONO layer stack including silicon oxide, followed by silicon nitride, followed by silicon oxide. A top surface of the floating gate 220 may be disposed above a top surface of the body region 250. Further, a bottom side of the floating gate 220 may be disposed beneath a bottom side of the body region 250. The source region 230, the drain region 240 and the body region 250 are disposed adjacent to the floating gate 220. The source region 230 is disposed adjacent to the first main surface 110 of the semiconductor substrate. The drain region 240 is disposed in a plane behind the depicted plane of the drawing. The body region 250 is disposed beneath the source region 230. A thin tunneling oxide 215 having a thickness of approximately 10 nm or less is disposed between the source region 230 and the floating gate 220 and between the body region 250 and the floating gate 220. The thickness of the dielectric layer is at a low value in a region adjacent to the body region so that the thin tunneling oxide 215 is disposed between the body region 250 and the floating gate 220. In a portion adjacent to the barrier layer 255 the thickness of the dielectric layer increases. A first contact 270 is disposed adjacent to the source region 230. An insulating layer 290 is disposed over the first main surface 110, followed by a conductive layer 295.

Figure 2C:
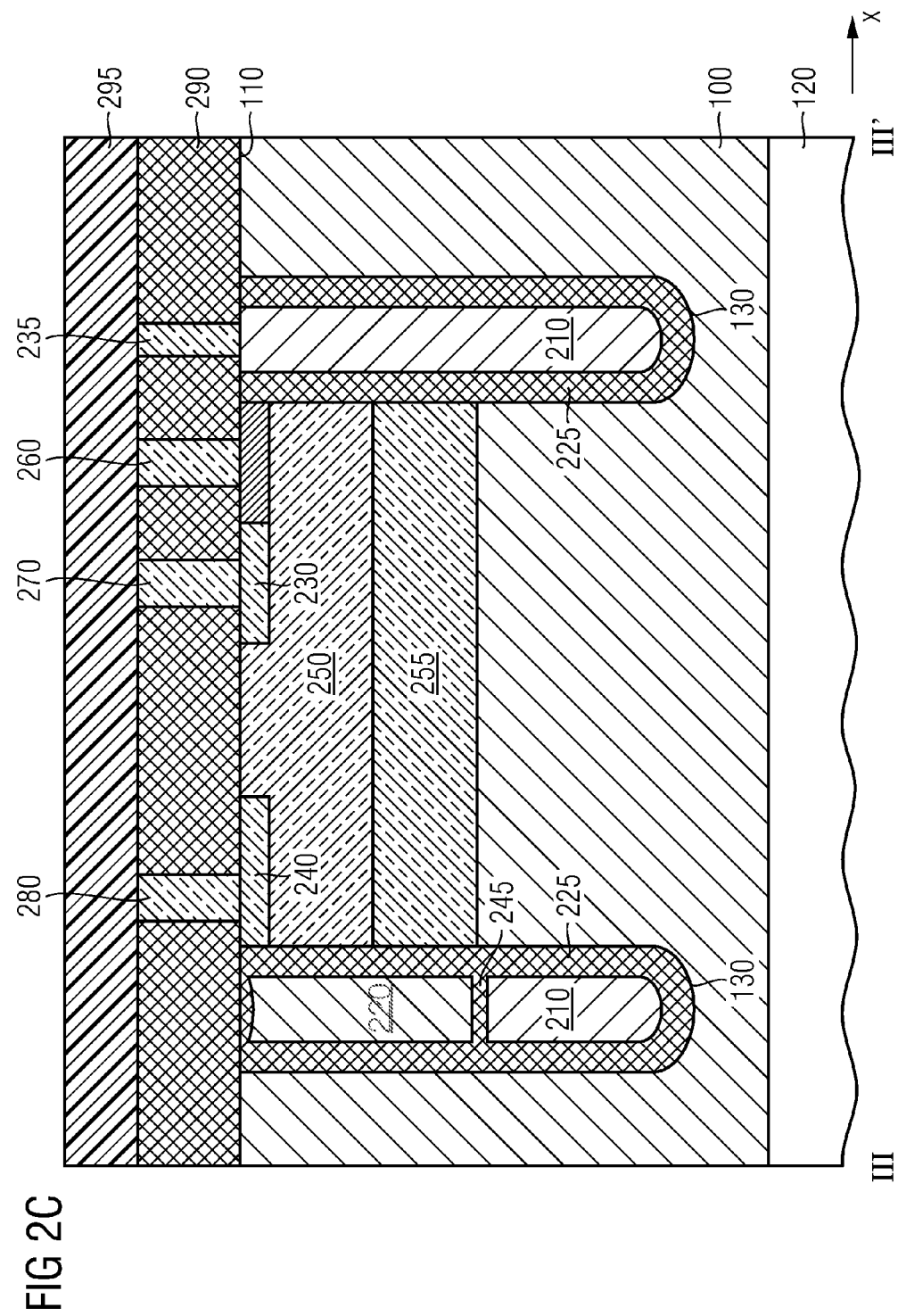
FIG. 2C shows a further cross-sectional view of components of the semiconductor device shown in FIG. 2A.

FIG. 2C shows a cross-sectional view along the x-direction between III and III' as is also shown in FIG. 2A.

The trench 130 on the left-hand side is filled with a control gate 210 in a lower portion thereof, followed by a floating gate 220. The trench on the right-hand side implements a control gate contact 235. Accordingly, the conductive material in the right-hand portion of the trench 130 extends from the first main surface 110 to a bottom portion of the trench 130. The filling of the trench 130 is insulated from surrounding material by the dielectric layer 225. Elements of the basic transistor 205 are disposed adjacent to the first main surface 110 of the semiconductor substrate. In particular, the source region 230 and the drain region 240 are disposed adjacent to the first main surface 110, the body region 250 being disposed between the source region 230 and the drain region 240. The first contact 270 electrically couples to the source region 230. Further, the second contact 280 electrically couples to the drain region 240. The body region 250 may be electrically coupled via the body contact 260. In FIG. 2C, the contacts 260, 270 and 280 are illustrated to be connected to a conductive layer 295. Nevertheless, as is to be clearly understood, the contacts 260, 270 and 280 may be disposed so as to be connected with different conductive materials.

As has been explained above, the charging state of the floating gate represents an information stored in the memory device 200. In order to exactly access the charging state of the floating gate 220, the so-called coupling capacitance between the control gate and the floating gate needs to be exactly adjusted. Accordingly, the trench in which the control gate and the floating gate are disposed is designed to have a predetermined geometry, in order to provide the desired coupling capacitance. According to embodiments, the trench in which the control gate and the floating gate are disposed forms a closed pattern. For example, there may be no end of the trench.

As is illustrated in FIGS. 2A to 2C, a semiconductor device is formed in a semiconductor substrate 100 comprising a first main surface 110. The semiconductor device 200 comprises a control gate 210 disposed in a lower portion of a first trench 130 formed in the first main surface and a floating gate 220 disposed in the first trench 130 above the control gate 210 and being insulated from the control gate 210. The semiconductor device 200 further comprises a source region 230 of a first conductivity type, a body region 250 of a second conductivity type, and a drain region 240 of the first conductivity type. A portion of the body region 250 is disposed adjacent to the floating gate 220. Further, the source region 230 may be disposed adjacent to the floating gate 220. For example, a tunneling oxide may be disposed between the portion of the body region 250 and a portion of the floating gate 220. In the context of the present specification, the term "floating gate" refers to a gate or a gate electrode, which is electrically insulated from adjacent conductive portions. In other words, the floating gate is not connected to a gate potential or another voltage source. Accordingly, the potential of the floating gate is "floating" which means that it cannot be set to a predetermined value by applying a corresponding voltage. According to embodiments, the potential of the floating gate can be changed by injecting charge carriers into the floating gate 220. According to the embodiment of FIGS. 2A to 2C, the source and the drain regions are doped with the first conductivity type, and the substrate 100 as well as the doped substrate region 120 are doped with the first conductivity type. The body region 250 is doped with the second conductivity type. A barrier layer 255 of the second conductivity type is disposed between the body region 250 and the semiconductor substrate 100. For example, a bottom side of the barrier layer 255 may be disposed at approximately the same height as the bottom side of the floating gate 220.

According to the embodiment of FIGS. 2A to 2C, the basic transistor 205 is implemented as a lateral or horizontal transistor. In other words, a current direction between source region 230 and drain region is approximately parallel to the first main surface 110. According to this embodiment, the source and the drain regions 230, 240 are disposed at approximately the same vertical distance from the first main surface 110 of the semiconductor substrate 100.

Figure 3A:
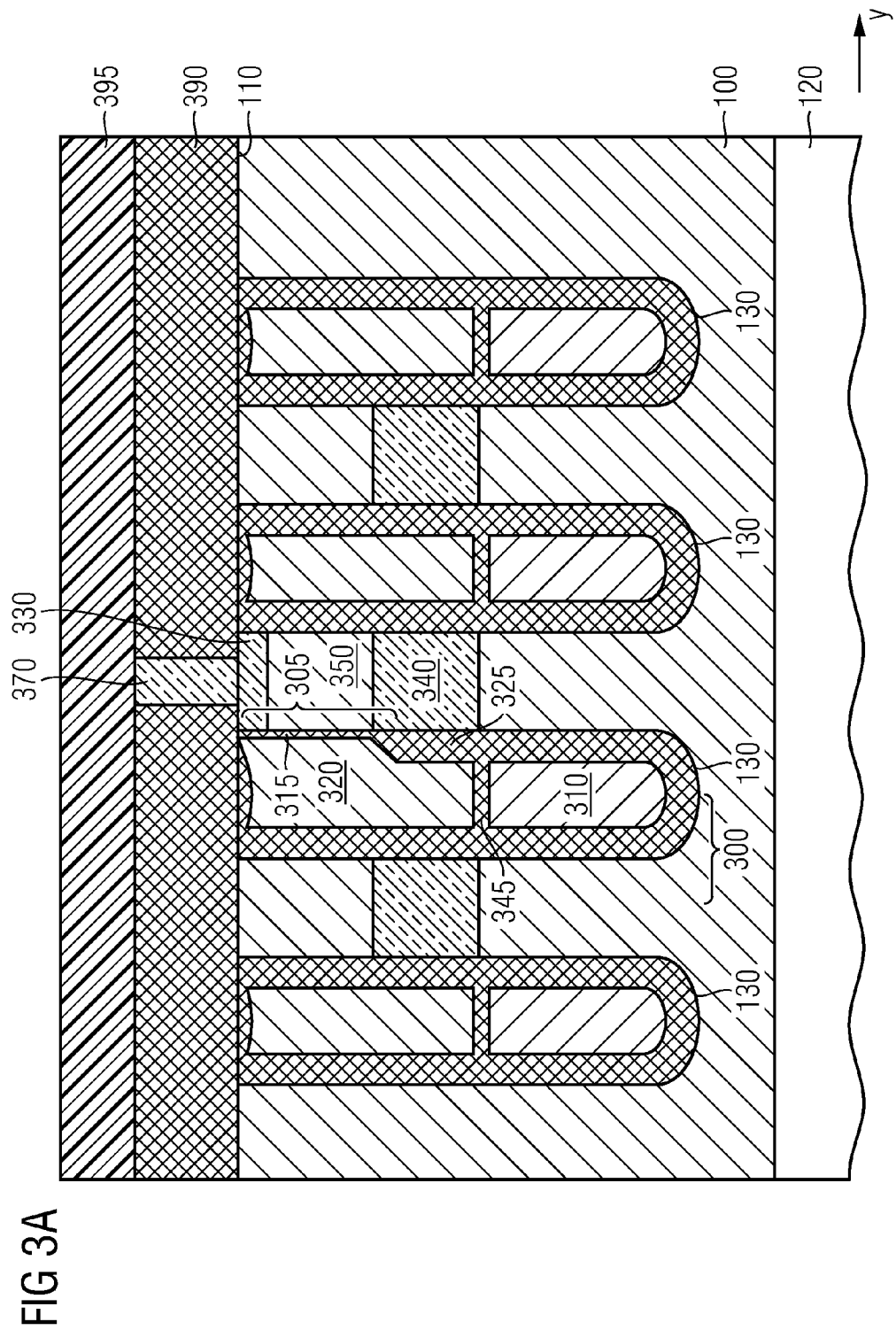
FIG. 3A shows a cross-sectional view of a semiconductor device according to an embodiment.
Figure 3B:
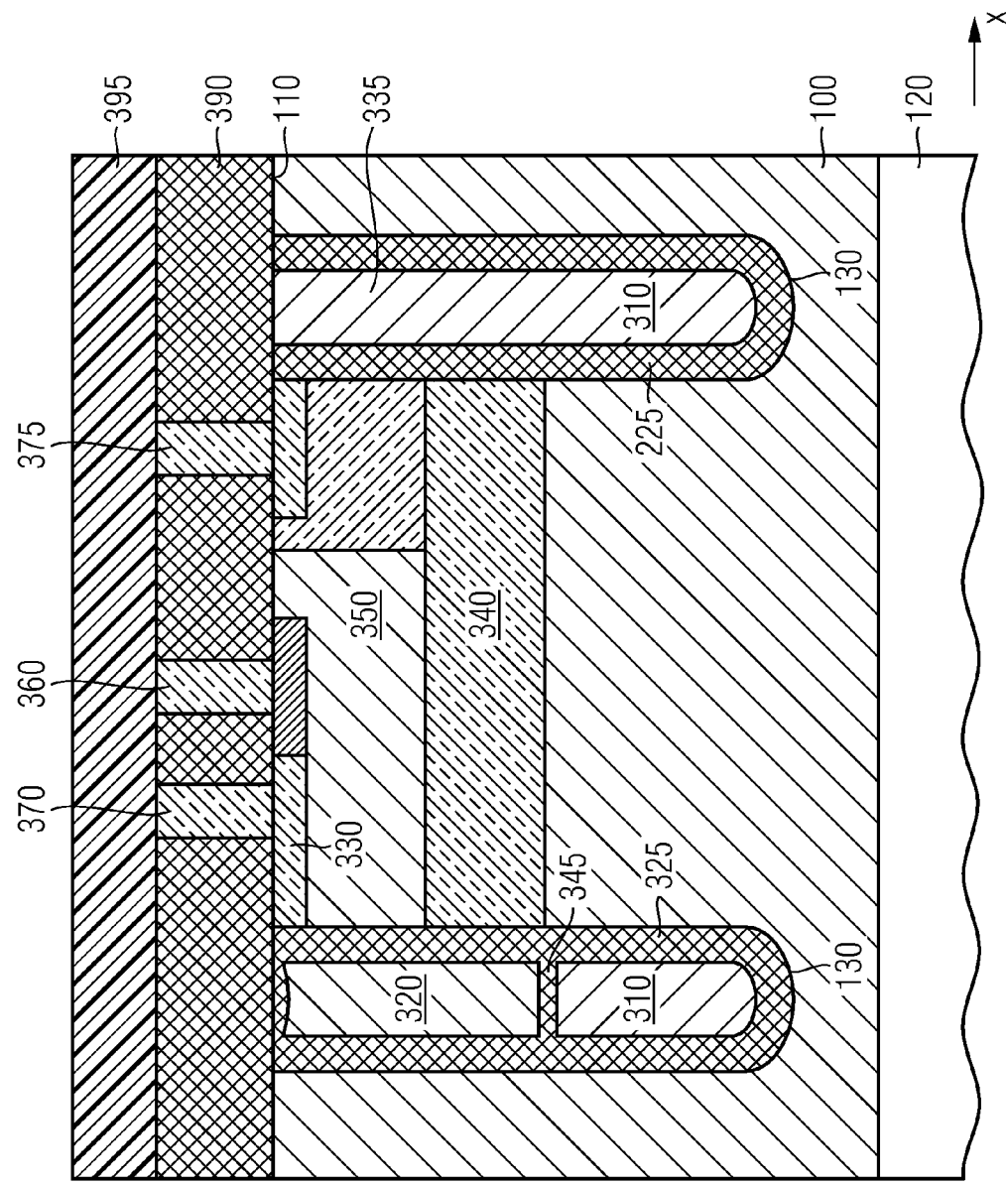
FIG. 3B shows a further cross-sectional view of the semiconductor device shown in FIG. 3A.

According to a further embodiment, the basic transistor 305 may be implemented as a vertical transistor in which a current flow is approximately perpendicularly with respect to the first main surface 110. FIGS. 3A and 3B show an example of such a semiconductor device. In FIG. 3A, the source region 330 is disposed adjacent to the first main surface 110. The body region 350 is disposed beneath the source region 330. Further, the drain region 340 is disposed below the body region 350. According to the embodiment of FIGS. 3A and 3B, the source and the drain regions 330, 340 are doped with the first conductivity type, and the substrate is doped with the second conductivity type. For example, the source and the drain regions 330, 340 may be p doped, whereas the semiconductor substrate 100 is n doped. A heavily doped region 120 of the second conductivity type may be disposed in a lower portion of the semiconductor substrate 100. A control gate 310 and a floating gate 320 are disposed in the trench 130 that is formed in the first surface 110 of the semiconductor substrate. When an appropriate voltage is applied between the source region 330 and the control gate 310, charge carriers, for example electrons, are moved to the floating gate 320, for example, by tunneling across the tunneling oxide layer 315, or by hot carrier injection. The electrons trapped in the floating gate 320 influence the threshold voltage of the basic transistor 305. Accordingly, in a similar manner as in the embodiment described with respect to FIGS. 2A to 2C, by evaluating the current voltage characteristics of the basic transistor 305, an information stored in the memory device 300 may read.

In the embodiment shown in FIG. 3A, a first contact 370 is provided so as to be electrically coupled to the source region 330. Contacts for contacting the body region 350 and the drain region 340 disposed in a plane before or behind the depicted drawing plane. The cross-sectional view of FIG. 3A is taken along the y-direction and basically corresponds to the direction of the cross-sectional view shown in FIG. 2B. In the embodiment of FIG. 3A, the thin tunneling oxide layer 315 is disposed between the body region 350 and the floating gate 320. Further, the thin tunneling oxide layer 315 is disposed between the source region 330 and the floating gate 320. The bottom side of the drain region 340 is disposed at approximately the same height as the bottom side of the floating gate 320. If the source region 330 is disposed beneath the body region 350, the bottom side of the source region 330 is disposed at approximately the same height as the bottom side of the floating gate 320. The source region 330, the drain region 340 and the body region 350 are disposed adjacent to the floating gate 320.

FIG. 3B shows a cross-sectional view of an embodiment of a semiconductor device along the x-direction, the direction corresponding to the direction along which the cross-sectional view of FIG. 2C is taken. FIG. 3B specifically shows the body contact 360 for electrically coupling to the body region 350 and the second contact 375 for electrically coupling to the drain region 340. FIG. 3B shows a thick dielectric layer 325 between the floating gate 320 and the body region 350, the source and the drain regions 330, 340. The trench 130 in the left-hand portion of FIG. 3B incorporates a control gate 310, over which the floating gate 320 is disposed, the floating gate 320 being insulated from the control gate 310 by means of a dielectric layer 345. A control gate contact 335 is disposed in the trench 130 illustrated in the right-hand portion of FIG. 3B. The conductive material of the control gate 310 entirely fills the trench 130 on the right-hand portion of FIG. 3B to thereby form the control gate contact.

As has been explained above, according to the embodiment of FIGS. 3A and 3B, the basic transistor 305 may be implemented as a vertical transistor. As is shown, one of the source and drain regions 330, 340 is disposed at a greater vertical distance from the first main surface 110 of the semiconductor substrate 100 than the other one of the source and drain regions. In the embodiment of FIGS. 3A and 3B, the source region is disposed adjacent to the first main surface 110, while the drain region 340 is disposed beneath the source region 330. As is to be clearly understood, according to a further embodiment, the drain region 340 may be disposed adjacent to the first main surface 110 of the semiconductor substrate 100, and the source region 330 may be disposed beneath the drain region 340. The doped region that is disposed beneath the body region 350, for example, the drain region 340 in case the drain region 340 is disposed beneath the source region, or the source region 330 in case the source region 330 is disposed beneath the drain region 340, is disposed between adjacent trenches so as to insulate the body region 350 from the underlying substrate material.

Figure 3C:
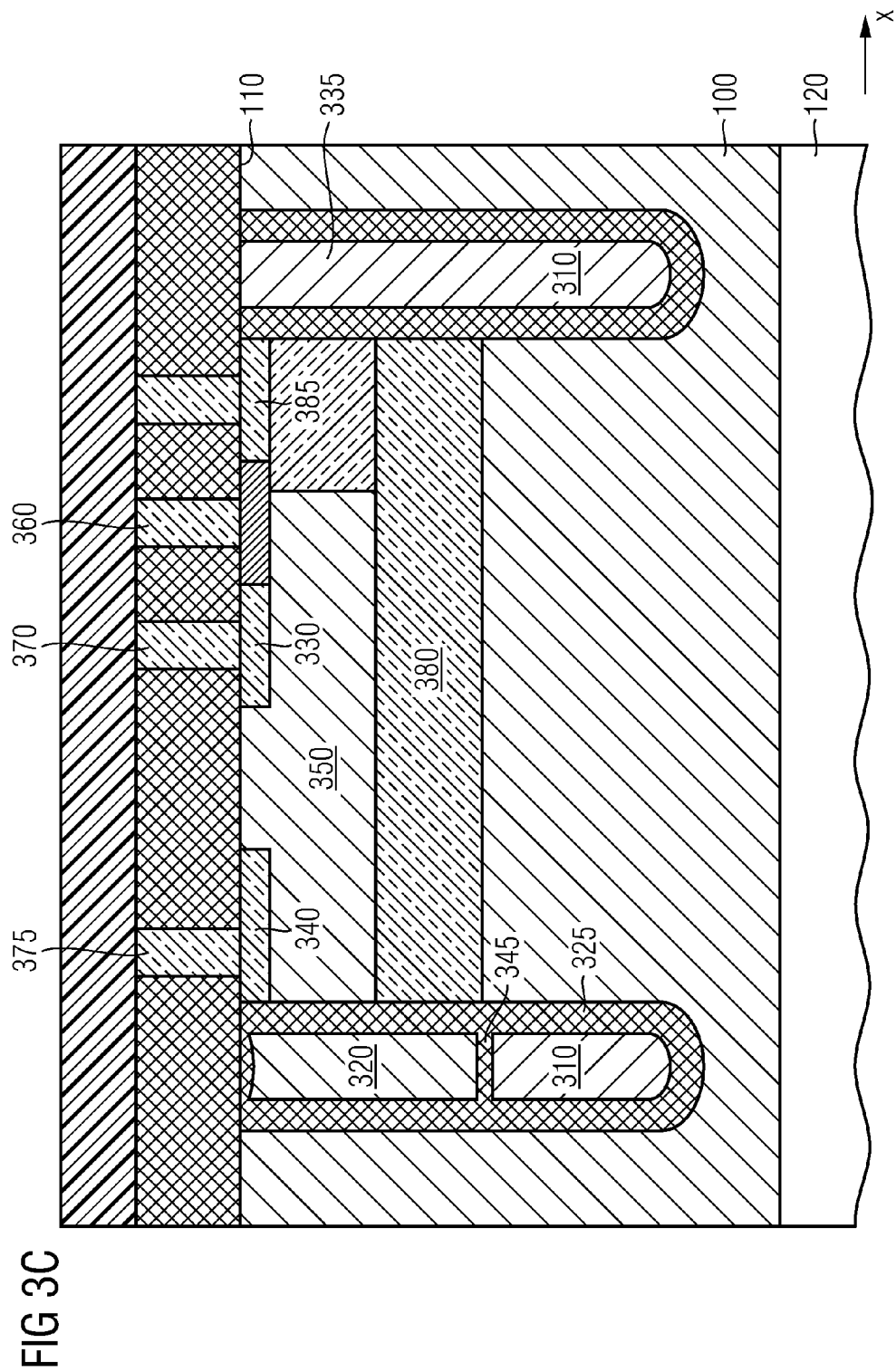
FIG. 3C shows a cross-sectional view of a semiconductor device according to still a further embodiment.

FIG. 3C shows a further embodiment in which the transistor is implemented as a horizontal transistor, the source and the drain regions 330, 340 are doped with the first conductivity type, and the substrate 100 is doped with the second conductivity type. As is illustrated in FIG. 3C, the source region 330 and the drain region 340 are disposed adjacent to the first main surface 110 of the semiconductor substrate 100. The body region 350 is disposed between the source and the drain regions 330, 340. The first contact 370 electrically couples to the source region 330. The second contact 375 electrically couples to the drain region 340. A body contact 360 electrically couples to the body region 350. The semiconductor device further comprises a barrier region 380 that is doped with the first conductivity type and which is disposed between the body region 350 and the semiconductor substrate 100. The barrier region 380 may extend between adjacent trenches 130. The barrier contact 385 electrically couples to the barrier region 380. A suitable potential may be applied to the barrier contact 385. For example, the same potential may be applied to the barrier contact 385 and to the body contact 360. The barrier region 380 may insulate the components of the memory device from the semiconductor substrate 100. The first and second contacts 360, 375, the body contact 360 and the barrier contact 385 may be disposed at the first main surface 110.

Figure 4A:
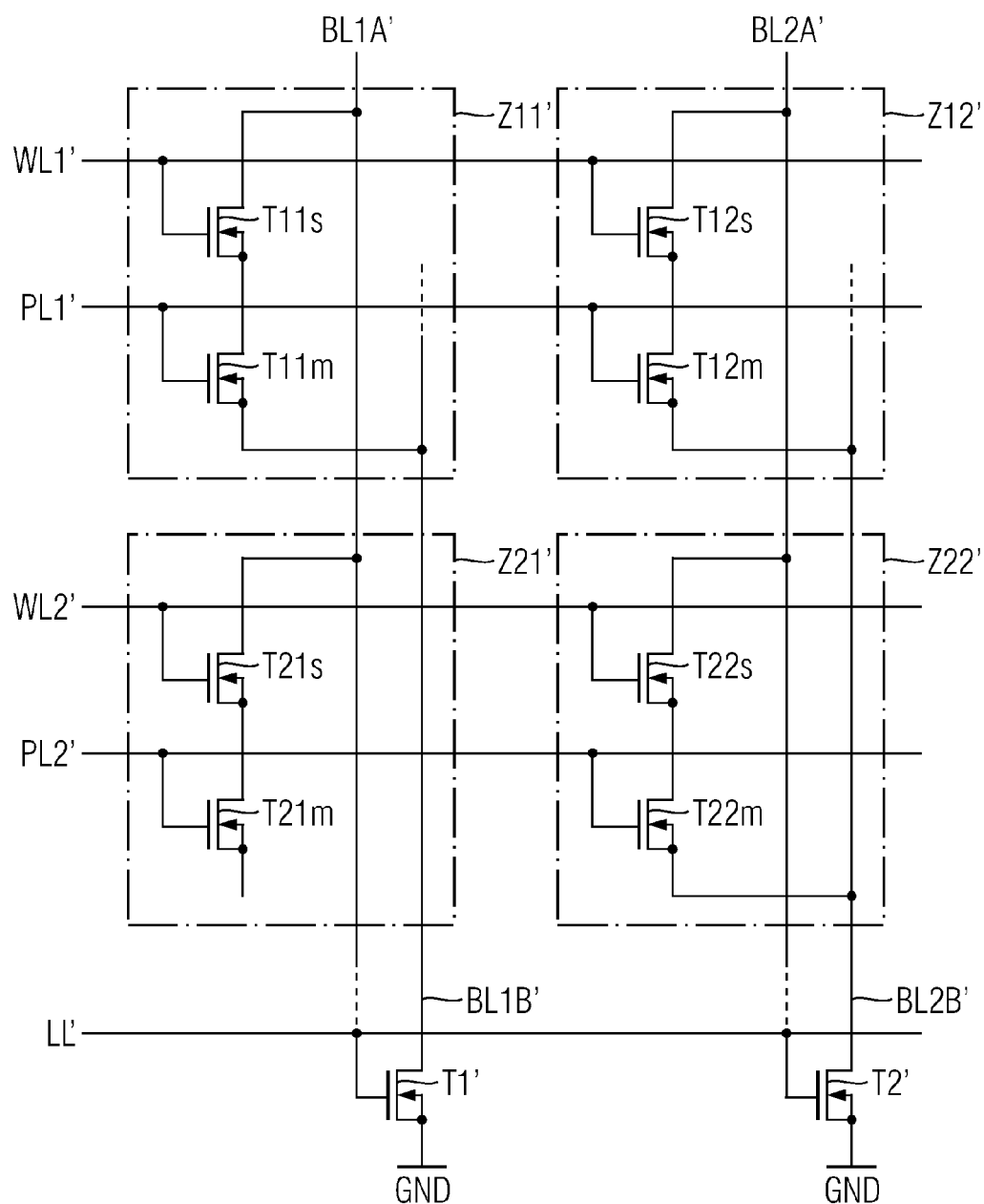
FIG. 4A shows an equivalent circuit diagram of a memory cell array.

According to an embodiment, an integrated circuit may comprise a memory cell array comprising a plurality of memory devices that have been explained above with reference to FIGS. 1 to 3. For example, these memory devices may be arranged in rows and columns and may be operated as is generally known. For example, the memory devices may be arranged in arbitrary array architectures. The memory devices may be coupled to select transistors in order to provide a select mechanism of single devices. FIG. 4A illustrates an equivalent circuit diagram of a memory cell array including for memory cells Z11', Z12', Z21', Z22'. The memory cells of one row are connected to a common word line WL1', WL2', and the memory cells of a column are connected to a common bit line pair BL1A', BL1B', BL2A', BL2B'. Each of the memory cells comprises a memory transistor T11m, T12m, T21m, and T22m in the manner as has been explained above. Further, each of the memory cells comprises a selection transistor T11s, T12s, T21s, and T22s. The source electrodes of each of the selection transistors T11s, T12s, T21s, and T22s are connected with the drain electrodes of each of the memory transistors T11m, T12m, T21m, and T22m. The gate electrodes of the each of the selection transistors T11s, T12s, T21s, and T22s of one row are connected to a common word line WL1', WL2', and the drain electrodes of each of the selection transistors of a column are connected to the first bit line BL1A', BL2A', of the bit line pair. The source electrodes of the memory transistors T11m, T12m, T21m, and T22m of one column of the memory matrix are connected to the second bit line BL1B', BL2B' of the bit line pair. The control gate electrodes of the memory transistors of a row of the memory matrix are connected to a common programming and read line PL1', PL2'.

According to an embodiment, the memory cell array may be implemented without select transistors. In this case, the word lines and the programming and read lines are merged. The control gate electrodes of the memory cells of one row are connected to a single word line.

For example, the bit lines and word lines and, optionally, programming and read lines may be implemented as conductive lines which are disposed over the semiconductor substrate. Nevertheless, according to a further embodiment, some of these lines may as well be implemented as buried lines and may, for example, be disposed within the semiconductor substrate.

Figure 4C:
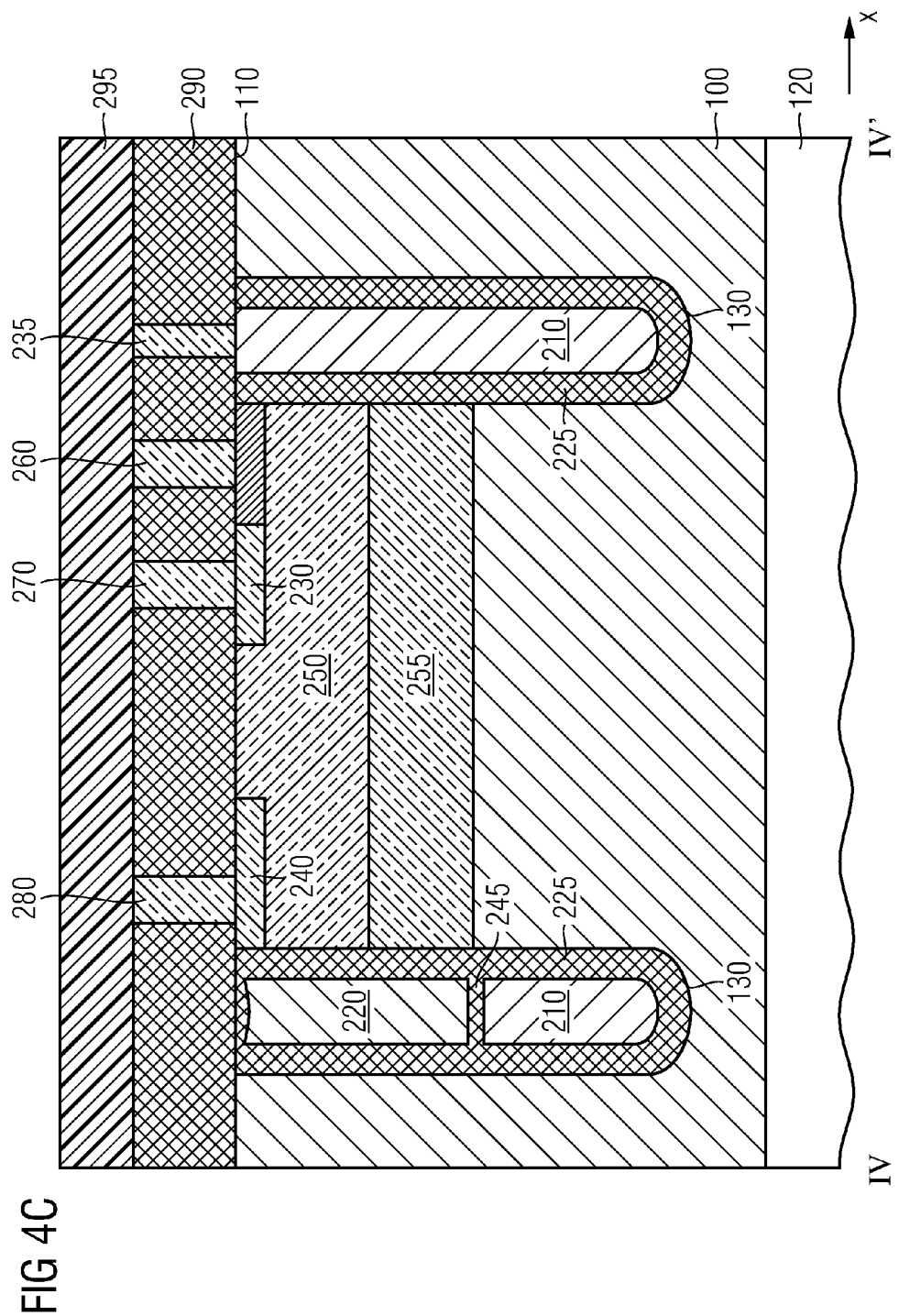
FIG. 4C shows a cross-sectional view of a portion of the memory cell array shown in FIG. 4B.

FIG. 4B shows an example of a memory cell in which the control gate is connected with control gates of further memory cells by means of a buried word line. For example, the buried word line 401 may be disposed within the trench 130. In the plan view of FIG. 4B, the buried word line 401 extends to the next memory cell. The upper portion of the conductive material disposed in the buried word line 401 is insulated from the floating gate by means of an insulating layer 435. The further components of FIG. 4B are identical to the respective components of FIG. 2A. Further, FIG. 4C shows a cross-sectional view of the device shown in FIG. 4B, the cross-sectional view being taken between the IV and IV' as illustrated in FIG. 4B. The cross-sectional view of FIG. 4C shows similar components as the cross-sectional view of FIG. 2C. FIG. 4D shows a cross-sectional view between V and V', as is also shown in FIG. 4B. FIG. 4D shows how the conductive material of the control gate electrode 210 is lead to the substrate surface so as to be connected with the gate contact 235. The control gate electrode 210 is insulated from the floating gate electrode 220 by means of the insulating layer 245.

Accordingly, the memory cell array according to this embodiment comprises a plurality of memory cells each being formed in a semiconductor substrate comprising a first main surface, each of the memory cells comprising a control gate disposed in a lower portion of a first trench, formed in the first main surface, a floating gate disposed in the first trench above the control gate and being insulated from the control gate, a source region of a first conductivity type, a body of a second conductivity type, and a drain region of the first conductivity type. The memory cells are arranged in rows and columns, and the memory cell array further comprises word lines being connected with corresponding ones of the control gates and bit lines being connected with corresponding ones of the drain regions. According to an embodiment, the word line may be implemented as a buried word line and may be disposed in a portion of the first trench.

FIG. 5A shows a plan view of an integrated circuit according to an embodiment. The integrated circuit 400 comprises a power component 402 and memory component 404. The memory component 404 may comprise one or more memory devices illustrated in FIGS. 2A to 2C or in FIGS. 3A to 3B. For example, the memory component 404 may comprise a memory cell array. The memory component may comprise a control gate disposed in a lower portion of a first trench formed in the first main surface and a floating gate disposed in the first trench above the control gate and being insulated from the control gate. Further, the memory device may comprise a source region of a first conductivity type, a body region of a second conductivity type, and a drain region of the first conductivity type. For example, the source region, the body region and the drain region may be disposed so as to implement a lateral transistor or these components may be disposed so as to implement a vertical transistor. Further, the power component 402 illustrated in FIG. 5A comprises a power transistor. For example, the power transistor 402 may comprise a source region 471 and a gate electrode 473, the gate electrode 473 being disposed in a second trench formed in the first main surface 110 of the semiconductor substrate 100.

Figure 5B:
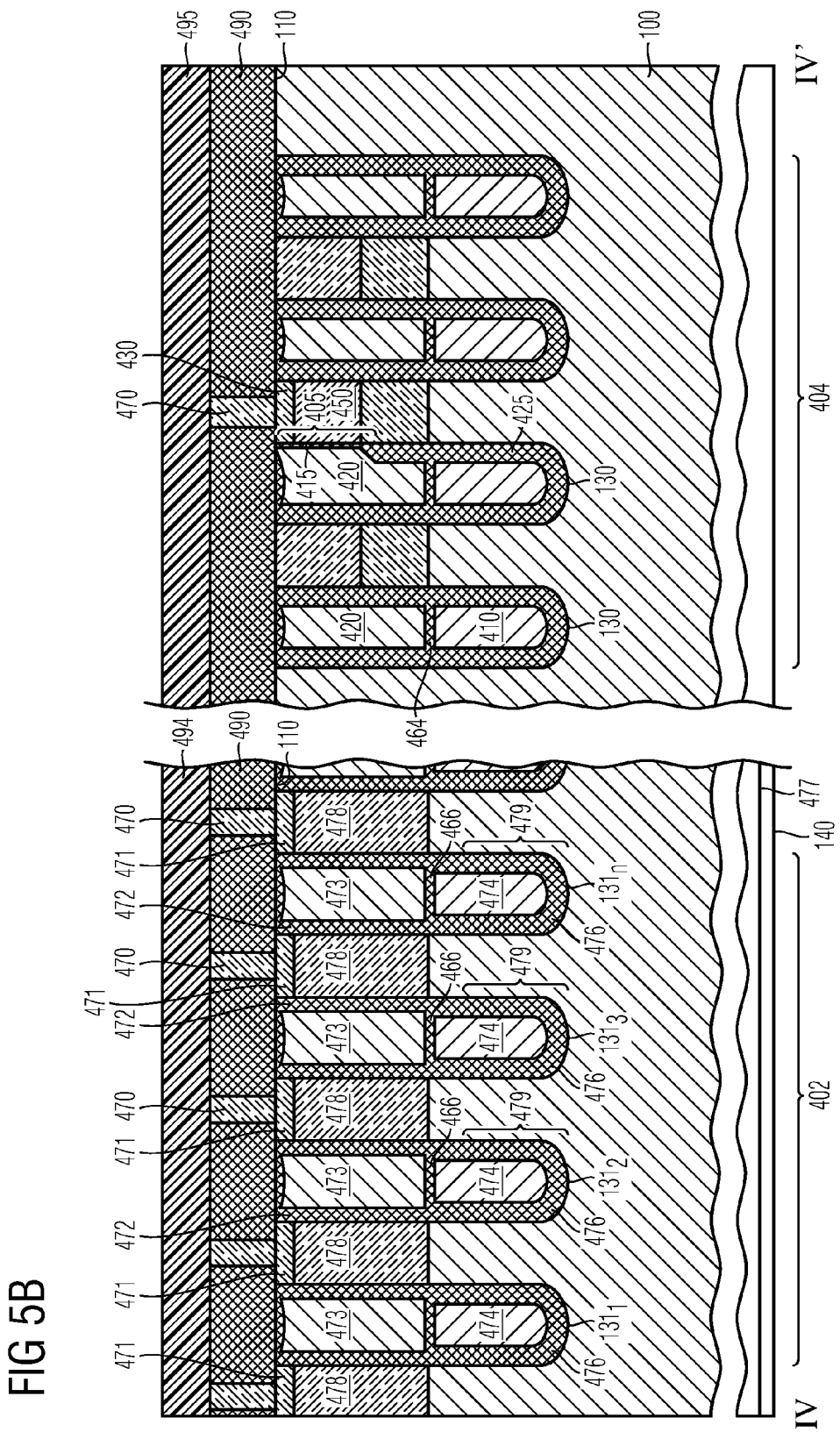
FIG. 5B shows a cross-sectional of the integrated circuit shown in FIG. 5A.

FIG. 5B shows a cross-sectional view of an example of the integrated circuit of FIG. 5A. The cross-sectional view has been taken between IV and IV' as is also illustrated in FIG. 5A. The right-hand portion of FIG. 5B illustrates a memory component 404 that may, for example, have the structure illustrated in FIG. 2B or 3A or 3B. According to the embodiment illustrated in FIG. 5B, the memory transistor 405 is implemented as a lateral transistor. A plurality of first trenches 130 and second trenches $131_1, \ldots 131_n$ are disposed in a first main surface 110 of a semiconductor substrate 100. According to the embodiment illustrated in FIGS. 5A and 5B, the first trenches 130 may be interconnected so as to form a single trench including trench portions extending in the x-direction and including trench portions extending in the y-direction. A control gate 410 is disposed in a lower portion of the first trenches in the memory component. Further, a floating gate 420 is disposed in an upper portion of each of the trenches 130, the floating gate 420 being insulated from the control gate 410. A source region 430 is disposed adjacent to the first main surface 110. A body region 450 is disposed beneath the source region 430. A thin tunneling oxide layer 415 is disposed between the floating gate 420 and the source region 430 and between the floating gate 420 and the body region 450. The source region 430 is electrically coupled to the conductive layer 495 by means of a first contact 470. The left-hand portion of FIG. 5B shows an example of a power component 402. A plurality of power transistors are arranged parallel to each other in the power component 402. Each of the power transistors comprises a source region 471 and a drain region 477 which is disposed at a second main surface 140 of the semiconductor substrate 100. A gate electrode 473 is disposed in each of the trenches $131_1, 131_n$, the gate electrode 473 being insulated from an adjacent body region 478 by means of a gate dielectric 472. A field plate 474 is disposed in a lower trench region, the field plate being insulated from an adjacent semiconductor material by means of a field dielectric layer 476. A drift region 479 is disposed beneath each of the body regions 478.

When the power transistor is operated in an on-state, a conductive channel is formed in the body region 478 being disposed adjacent to the gate electrode 473. Accordingly, a current flows from the source region 471 to the drain region 477 via the conductive channel formed in the body region 478 and the drift region 479. If an off-voltage is applied to the gate electrode 573, no conductive channel is formed, and, due to the presence of the field plate 474, charge carriers in the drift regions 479 may be quickly removed so that no current flow takes place between the source region 471 and the drain region 477.

According to embodiments of the present application, forming the memory component 404 and forming the power component 402 may be performed using joint processing methods. For example, the first and the second trenches 130, $131_1, \ldots 131_n$ may be etched using a single etching method. It will be appreciated that according to embodiments, the first trench 130 and the second trenches 131 may extend to approximately the same depth. Further, the method of forming the control gate 410 and the field plate 474 may be performed by joint processing steps. For example, one single conductive material may be deposited in order to form the control gate 410 and the field plate 474.

Moreover, the dielectric layer 425 and the field dielectric layer 476 may be formed by joint processing steps. For example, a single thermal oxidation step may be performed in order to form the dielectric layer 425 and the field dielectric layer 476. After forming the control gate 410 and the field plate 474 in the lower portion of the trenches 130, 1311, ... 131n, the intermediate dielectric layer 464 and 466, that is formed between the lower conductive material and the upper conductive material in each of the trenches, may be formed by joint processing steps. For example, the intermediate dielectric layer 464 in the memory component may comprise an ONO layer stack, and the intermediate dielectric layer 466 in the power component may comprise silicon oxide. According to embodiment, the intermediate dielectric layer 466 in the power component 402 and at least one silicon oxide layer of the ONO layer stack in the memory component 404 may be formed by joint processing steps. Additionally, the conductive material for forming the floating gate 420 and the gate electrode 473 may be formed by joint processing steps. Further, the conductive material in the first and second trenches may be etched back by joint processing steps.

As a result, for example, the control gate 410 in each of the first trenches 130 may extend to the same height measured from the first main surface 110 of the semiconductor substrate as the field plate 474 in the second trenches $131_1, \ldots, 131_n$. Further, the floating gate 420 in each of the first trenches may extend to the same depth as measured from the substrate surface 110 as the gate electrode 473 in the second trenches $131_1 \ldots 131_n$. Thereafter, as is common, further processing steps may be performed so as to define the source and drain regions and further doped regions.

FIG. 6 schematically illustrates a flowchart of a method of manufacturing an integrated circuit. As is shown, the method may comprise forming a power transistor S10 in a semiconductor substrate including a first main surface and forming a memory device S20 in the semiconductor substrate. Forming the memory device S20 may include forming a first trench S21 in the first main surface of the semiconductor substrate, forming a control gate S22 in a lower portion of the first trench, forming a floating gate S23 in the first trench above the control gate so as to be insulated from the control gate, and forming a source region of a first conductivity type, a body region of a second conductivity type, and a drain region of the first conductivity type in the semiconductor substrate S24. According to an embodiment, components of the power transistor and components of the memory device may be formed by joint processing processes. For example, forming the power transistor S10 may comprise forming a second trench S11 in the first main surface of the semiconductor substrate, and the first and the second trenches may be formed by joint processing methods. Further, the filling of the first and second trenches may be formed by joint processing methods.

According to the method explained above, a memory device may be manufactured using processing methods that are performed for manufacturing the power transistor. As a consequence, the memory device may be manufactured without a significant increase of processing steps and without a significant increase of cost.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, formed in a semiconductor substrate comprising a first main surface, the semiconductor device comprising:
   a control gate disposed in a lower portion of a first trench formed in the first main surface;
   a floating gate disposed in the first trench above the control gate and insulated from the control gate;
   a source region of a first conductivity type, a body region of a second conductivity type, and a drain region of the first conductivity type, wherein a portion of the body region is adjacent to the floating gate.

2. The semiconductor device according to claim 1, further comprising:
   a first contact electrically coupling to the source region; and
   a second contact electrically coupling to the drain region, the first contact and the second contact being disposed at the first main surface.

3. The semiconductor device according to claim 1, wherein the source and the drain regions are disposed adjacent to the first trench.

4. The semiconductor device of claim 1, wherein the floating gate is insulated from an adjacent semiconductor substrate material by a dielectric material.

5. The semiconductor device of claim 1, wherein the first trench includes first portions extending along a first direction parallel to the first main surface, a mesa defined between first portions, wherein
   the source region, the body region, and the drain region are disposed in the mesa.

6. The semiconductor device of claim 1, wherein one of the source and drain regions is disposed at a greater vertical distance from the first main surface of the semiconductor substrate than the other one of the source and drain regions.

7. The semiconductor device of claim 1, wherein the source and the drain regions are disposed at approximately the same vertical distance from the first main surface of the semiconductor substrate.

8. The semiconductor device according to claim 2, wherein the source and the drain regions are disposed at the first main surface.

9. The semiconductor device according to claim 8, wherein the source and the drain regions are disposed adjacent to the first main surface.

10. The semiconductor device of claim 4, wherein the dielectric material has a first thickness in a first region and a second thickness in a second region, the first region arranged between the body region and the floating gate and the second region arranged between the floating gate and a semiconductor substrate material different from the body region.

11. An integrated circuit formed in a semiconductor substrate comprising a first main surface, the integrated circuit comprising:
    a power transistor; and
    a memory device, the memory device including:
       a control gate disposed in a lower portion of a first trench formed in the first main surface;
       a floating gate disposed in the first trench above the control gate and being insulated from the control gate;
       a source region of a first conductivity type, a body region of a second conductivity type, and a drain region of the first conductivity type.

12. The integrated circuit according to claim 11, wherein the power transistor comprises a power device source region, a power device drain region, a power device body region and a gate electrode, the gate electrode disposed in a second trench formed in the first main surface of the semiconductor substrate.

13. The integrated circuit according to claim 11, wherein the first and the second trenches have the same depth.

14. The integrated circuit according to claim 11, wherein one of the source and drain regions of the memory device are disposed at a greater vertical distance from the first main surface of the semiconductor substrate than the other one of the source and drain regions.

15. The integrated circuit according to claim 11, wherein the source and the drain regions of the memory device are disposed at approximately the same vertical distance from the first main surface of the semiconductor substrate.

16. A method of manufacturing an integrated circuit, comprising:
    forming a power transistor in a semiconductor substrate comprising a first main surface; and
    forming a memory device in the semiconductor substrate, wherein forming the memory device includes:
    forming a first trench in the first main surface of the semiconductor substrate;
    forming a control gate in a lower portion of the first trench;
    forming a floating gate in the first trench above the control gate so as to be insulated from the control gate;
    forming a source region of a first conductivity type, a body region of a second conductivity type, and a drain region of the first conductivity type in the semiconductor substrate.

17. The method of claim 16, wherein components of the power transistor and components of the memory device are formed by joint processing processes.

18. The method of claim 16, wherein forming the power transistor comprises:
    forming a second trench in the first main surface of the semiconductor substrate.

19. The method of claim 18, wherein the first and the second trenches are formed by joint processing methods.

* * * * *